(12) United States Patent
Cok

(10) Patent No.: US 7,394,194 B2
(45) Date of Patent: Jul. 1, 2008

(54) TILED DISPLAY

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 439 days.

(21) Appl. No.: 10/995,585

(22) Filed: Nov. 23, 2004

(65) Prior Publication Data

US 2006/0108913 A1    May 25, 2006

(51) Int. Cl.
*H05B 33/00*    (2006.01)
*H01J 1/62*    (2006.01)

(52) U.S. Cl. .................. 313/506; 313/500; 313/504; 313/512; 428/917; 345/82; 345/84

(58) Field of Classification Search ................. None
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,585,695 A | 12/1996 | Kitai | |
| 6,274,978 B1 | 8/2001 | Roach et al. | |
| 6,498,592 B1 | 12/2002 | Matthies | |
| 6,624,570 B1 * | 9/2003 | Nishio et al. | 313/506 |
| 6,683,665 B1 | 1/2004 | Matthies | |
| 2004/0016568 A1 | 1/2004 | Palanisamy | |
| 2004/0189213 A1 * | 9/2004 | Okazaki et al. | 315/169.1 |
| 2005/0116616 A1 | 6/2005 | Koeda | |

FOREIGN PATENT DOCUMENTS

| | | | |
|---|---|---|---|
| EP | 1 237 141 | | 9/2002 |
| EP | 1 253 643 | | 10/2002 |
| EP | 1223458 A | * | 7/2003 |
| EP | 1 437 703 | | 7/2004 |
| JP | 2001-175204 | | 6/2001 |
| WO | WO 03/042966 | | 5/2003 |

* cited by examiner

*Primary Examiner*—Sikha Roy
(74) *Attorney, Agent, or Firm*—Frank Pincelli

(57) ABSTRACT

A tiled display structure having a plurality of display tiles. Each display tile comprising a tile substrate, first electrodes located on a first side of the tile substrate, light emitting or controlling materials deposited over the first electrodes, and second electrodes deposited over the light emitting or controlling material. A back panel is provided having a plurality of back-panel conductors located on a first side of the back panel. The display tiles are mounted upon the back panel with the first side of the tile substrate adjacent to the first side of the back panel and the first and second electrodes electrically connected from the first side of the tile substrate through electrical standoff connectors to the back-panel conductors.

22 Claims, 2 Drawing Sheets

TILED DISPLAY

FIELD OF THE INVENTION

The present invention relates to flat-panel display systems composed of multiple tiles and, more particularly, to the interconnections necessary to supply signals to the display.

BACKGROUND OF THE INVENTION

Electronic display systems are commonly used to display information from computers. Typical display systems range in size from small displays used in mobile devices to very large displays visible to thousands of viewers. Large displays are sometimes created from tiling smaller display devices together. For example, video walls using multiple video displays are frequently seen in the electronic media and flat-panel displays are tiled to create larger displays. Multiple projector systems used to create a large, tiled, high-resolution display are also available.

Tiled displays are well known in the prior art. For example, U.S. Pat. No. 6,683,665B1 issued Jan. 27, 2004 describes tile structures wherein each tile has a display portion and an electronics portion. The tiles are fastened together into an array with the use of a frame. Alternatively, U.S. Pat. No. 6,498,592 issued Dec. 24, 2002 describes the use of a single substrate with electrical devices and a display. However, as disclosed, these designs require the use of vias (electrical connections) through the electronics substrates and are problematic for displays requiring a hermetic seal for the display components, for example in an OLED display. Vias in glass substrates are difficult to construct and the use of alternative substrates are not well-suited to sealing the display materials. Moreover, the design requires an additional frame and is not well suited to roll-to-roll manufacturing.

Another technique that relies on overlapping the display tiles is described in WO 03/042966 entitled "Display for a Large Panel Display Consisting of Tiled Displays". This method uses a complex support structure and a plurality of printed circuit boards. Moreover, tile seams may be visible when the display is viewed off angle.

Connections providing an electrical connection between two surfaces that are not physically touching are known. See for example, U.S. Publication 2004/0016568 entitled "Low-Cost Circuit Board Materials and Process for Area Array Electrical Interconnections over a Large Area between a Device and the Circuit Board" by Palanisamy published Jan. 29, 2004.

There is a need therefore for an improved tiled display system that overcomes the problems noted above.

SUMMARY OF THE INVENTION

In accordance with the present invention there is provided a tiled display structure, comprising:

a) a plurality of display tiles, each display tile comprising a tile substrate, first electrodes located on a first side of the tile substrate, light emitting or controlling materials deposited over the first electrodes, and second electrodes deposited over the light emitting or controlling material;

b) a back panel having a plurality of back-panel conductors located on a first side of the back panel; and c) wherein the display tiles are mounted upon the back panel with the first side of the tile substrate adjacent to the first side of the back panel and the first and second electrodes electrically connected from the first side of the tile substrate through electrical standoff connectors to the back-panel conductors.

ADVANTAGES

The present invention has the advantage that the tiled display utilizes very simple electrical interconnections. The simple connections reduce manufacturing cost and improve reliability.

These and other aspects, objects, features and advantages of the present invention will be more clearly understood and appreciated from a review of the following detailed description of the preferred embodiments and appended claims and by reference to the accompanying drawings.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

The layers of the figures are not to scale, since the differences in size of the elements in the figures are too great to permit depiction at scale.

DETAILED DESCRIPTION OF THE INVENTION

Figure 1:
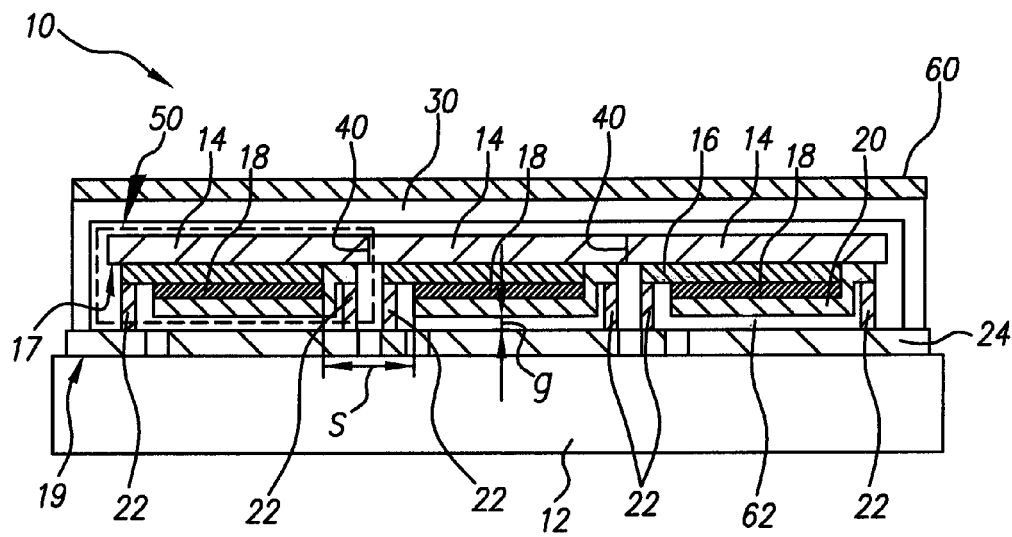
FIG. 1 is a cross section of a tiled display according to one embodiment of the present invention.

Referring to FIG. 1, there is illustrated a cross sectional view of display 10 made in accordance with the present invention. The present invention provided an improved design for providing electrical connections to a tiled display 10. Tiled display 10 includes a plurality of display tiles 50, each display tile 50 comprising a tile substrate 14, first electrodes 16 located on a first side 17 of the tile substrate 14, light emitting or controlling materials 18 deposited over the first electrodes 16, and second electrodes 20 deposited over the light emitting or controlling material 18; and a back panel 12 having a plurality of back-panel conductors 24 located on a first side 19 of the back panel 12. The plurality of display tiles 50 are mounted upon the back panel 12 with the first side 17 of the tile substrate adjacent to the first side 19 of the back panel 12 and the first and second electrodes 16, 20 electrically connected from the first side 17 of the tile substrate 14 through electrical standoff connectors 22 to the back-panel conductors 24.

The tile substrates 14 of display tile 50 are butted together to form a seam 40. The seam 40 may be coated with an optical matching adhesive to improve the optical transparency of the seam 40 and to firmly locate the tile substrates 14 of tiles 50 adjacent to each other. The electrodes 16 and 20 may be considered row and column electrodes in a passive-matrix control scheme or, alternatively, as anode and cathode in an active-matrix control scheme with thin-film circuitry provided between the electrical standoff connectors 22 and the electrodes 16, 20 (particularly the first electrode 16). The electrical standoff connectors 22 are electrically conductive materials having a width so as to prevent the second electrode 20 from contacting the conductors 24 or the surface of the back panel 12.

Figure 2:
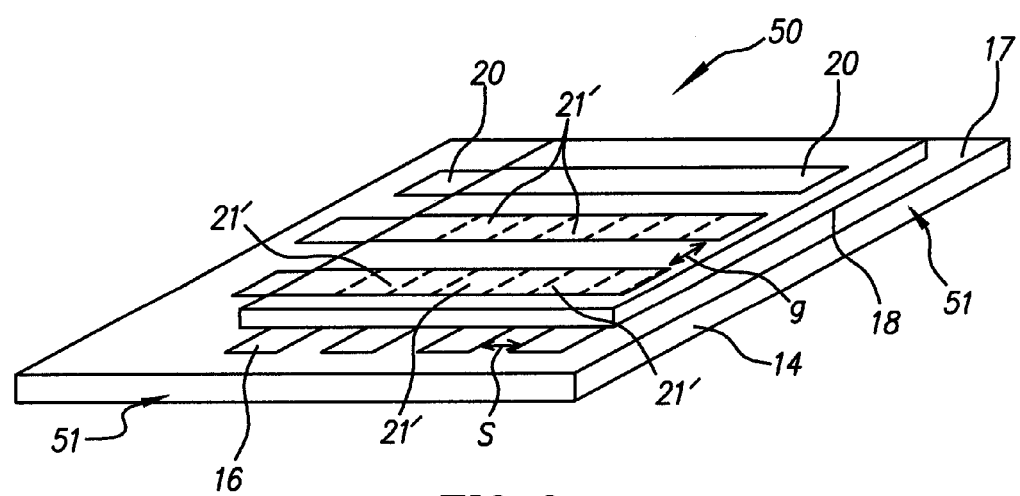
FIG. 2 is an isometric view of one tile in a tiled display according to an embodiment of the present invention.

Referring to FIG. 2, an isometric view of one tile 50 is shown. The first electrodes 16 are located over the tile substrate 14. Light emitting or controlling materials 18 cover the first electrodes 16 and second electrodes 20 are located over the light emitting or controlling material 18. The second electrodes 20 extend onto the tile substrate 14. As depicted in FIG. 2, the electrodes define a passive matrix control structure. However, it is anticipated that additional electronic circuitry can be defined on the tile substrate 14 to form an active-matrix control structure. In this case, it is possible that the second electrode 20 is continuous over the surface of the material 18 and common to all light emitting or controlling elements/pixels 21, indicated by dash lines, and only a single electrical connection is needed for the common electrode. Passive and active-matrix control schemes and circuits are well known in the art and practiced, for example, with liquid crystal (LCD) displays and organic light emitting diode (OLED) displays. Light emitting materials for an organic light emitting diode display may include, for example, multiple layers such as hole-injection, hole-transport, electron-injection, electron-injection, and emissive layers as is known in the prior art.

While electrodes 16 and 20 in FIG. 1 appear to contact each other, in practice the electrodes 16, 20, as best illustrated by reference to FIG. 2, are two separate segments that provide individual control of individual light emitting elements 21. The organic materials 18 may be deposited as a continuous layer (as is electrode 20 if an active-matrix control method is employed). In FIG. 2, the overlapping area between the electrodes 20 and 16 will be light emissive and form individual light emitting elements (pixels) 21. It is essential that the spacing S between the pixels 21 is consistent on each tile 50 and between edge pixels 21' on neighboring tiles so that the tile joins are not visible. Edge pixels 21' are the pixels nearest the edge 51 of a tile 50. The distance between neighboring pixels on a tile must be equal to the distance between edge pixels on neighboring tiles in both dimensions. In FIG. 1, the standoff electrical connectors 22 are shown on each side of each tile 50. While this is a useful configuration, it is also useful to provide standoff electrical connections 22 on only one or two sides of tile 50 (as shown in FIG. 2) to reduce the number of connections 22 that must be placed between edge pixels 21' on neighboring tiles 50.

Figure 3:
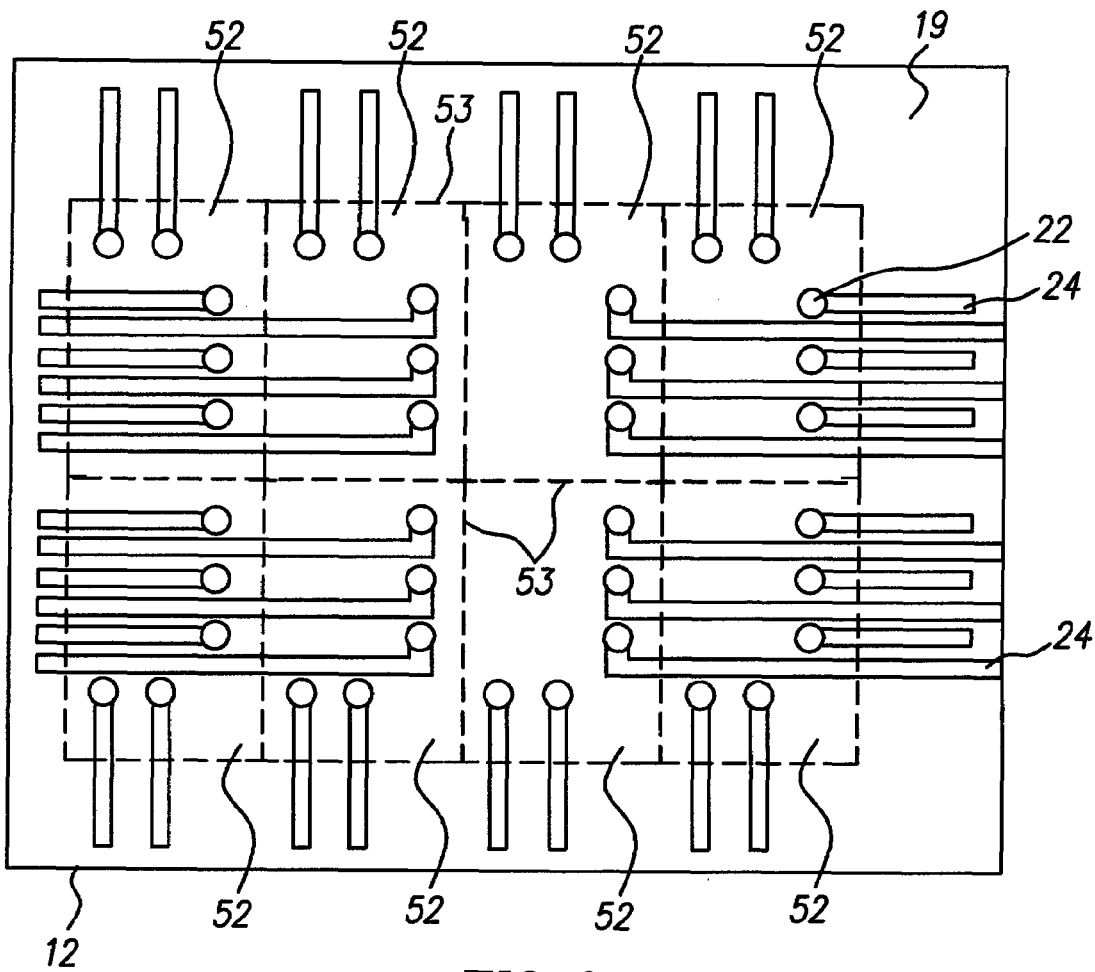
FIG. 3 is a plan view of a back panel of a tiled display according to an embodiment of the present invention.
Figure 4:
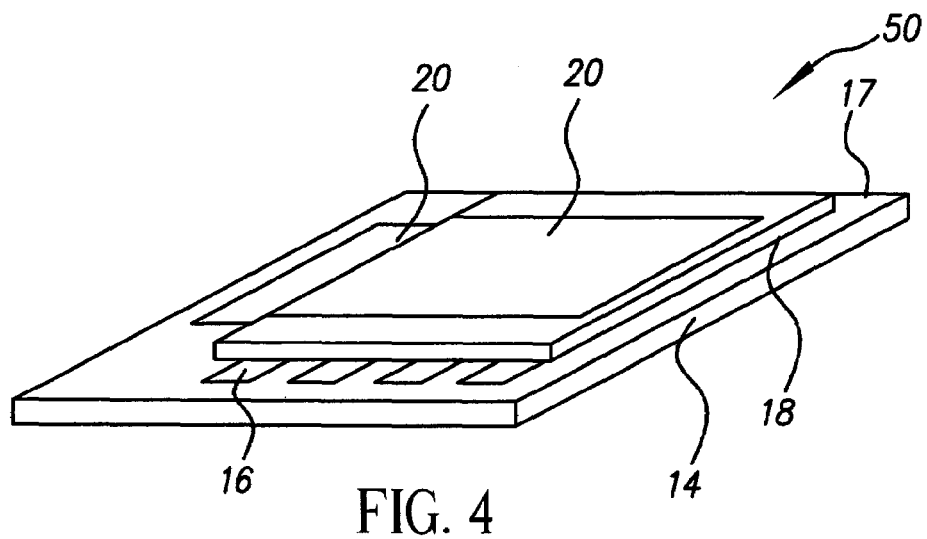
FIG. 4 is a perspective view of a single display tile of FIG. 1.

Referring to FIG. 3, there is illustrated a top plan view of back panel 12 that includes interspersed conductors 24 connected to electrical standoff connectors 22. Connectors 22 and conductors 24 are provided for each display tile 50 to be located at tile locations 52. The display tiles 50 to be placed on back panel 12 may form a two-dimensional array (as shown by dash line) or a one-dimensional array (not shown) depending on the configuration of the display tiles 50, the back panel 12, and the preferred format of the display 10. The conductors 24 may be provided in single layer (as shown) or in a multi-layer configuration (not shown), as is known in the printed circuit board art. Preferably, the connectors 24 are screen printed on panel 12 and processed as known in the art to provide the conductors and connections suitable for affixing the display tiles 50. If the display tiles 50 (or a component of the tiles, for example an organic material such as is found in OLED devices) are heat sensitive, low-temperature connection processes and connection materials or processes for locally heating connection materials are preferred. Such materials are known in the art, for example, employing low-temperature solder formulations.

The back panel 12 may be made of conventional glass or other substrate material described in the art, for example metal or plastic. However, as shown in FIGS. 1 and 2, the back panel 12 must provide a seal to prevent environmental contamination for example moisture, from contaminating the materials 18. The conductors 24 may be coated on the back panel 12 using screen printing techniques as are known in the art. However, if a conductive material is used (e.g. metal) as the back panel, suitable insulating materials should be provided over the back panel to maintain the integrity of the conductors 24.

The electrical standoff connectors 22 may be made by a variety of techniques. The essential requirements are that the connectors conduct electricity and provide for a gap G between the tile substrate 14 and the back panel 12. Since the electrodes 16 and 20, together with the layer of material 18, are typically less than a micron in thickness (for example 100 nm), any gap G greater than a micron is adequate. Conventional solder materials when flowed onto stacked surfaces may provide a gap of about 25 microns, more than adequate for this purpose. Alternatively, pins may be employed or deformable metal connectors such as Z connectors. These interconnection technologies are known and practiced in the art.

The gaps S between the pixels 21 are an important aspect of any actual design. The larger the gaps, the easier the manufacturing process becomes. A design done by applicants specifies a 0.5 mm gap S between pixel/light emitting elements 21. Conventional high density packaging techniques can provide connectors 24 having a size of 0.3 mm. With connections placed on two sides of a rectangular tile substrate, the remaining space can provide a margin for the connector 24 and between the edge pixel 21' and the physical edge 51 of the tile substrate 12.

In an alternative design, vias may be provided between pixels 21 in tile 50 (preferably not at the edge of the tile substrate) may be utilized. In this case, any continuous material coatings, e.g. a light-emissive OLED layer and/or cathode layer, must be interrupted to form vias into which the electrical standoff connectors 22 can be placed. In practice, a portion of an organic coating can be readily ablated without harming the effectiveness of the device 10 in the inter-pixel area and, since a thin organic coating does not readily conduct current along the layer parallel to the tile substrate (as opposed to through the layer), the functionality of the device is not affected. However, it is important to form a clear spacing about the connector 22 in the second electrode 20 to avoid an electrical short between the first and second electrodes 16, 20. Such a spacing can be formed by locally ablating layers of materials using a laser, as described in U.S. application Ser. No. 10/462,360 filed Jun. 16, 2003 by Ronald S. Cok et al. If electrical standoff connectors 22 are used on the tile edges 51, the edges 51 should be masked when depositing any light emissive or controlling materials or conductors 20 so that material 18 is not deposited on the electrical standoff connections 22. In one manufacturing embodiment, a plurality of the tiles 50 may be formed in a single step on a larger substrate, a connection to each of the first and second electrodes 16, 20 is exposed through ablation (for example, laser ablation), the tiles 50 separated, for example using conventional scribing and breaking techniques, the tiles 50 are tested, and the good tiles 50 assembled with the panel substrate 12.

In operation, power is provided to the conductor 24 back panel 12 in the form of a voltage difference and current supply. The conductors 12 conduct electricity to the electrical standoff connectors 22 to each tile 50. The electrical standoff connectors 22 are electrically connected to the electrodes 16 and 20 and cause the light emissive or controlling materials 18 to activate. If the display tiles 50 and back panel 12 are transparent, a backlight may be employed to pass light through the display 10 where light controlling materials allow it. However, in a preferred embodiment, the light is emitted through the tile substrate 14 in a bottom emitter configuration. Control for the display tiles 50 may be provided by integrated circuits such as display drivers or controllers around the perimeter of the back panel 12.

An encapsulating cover 30, as illustrated by FIG. 1, is optionally provided over the entire back panel 12 to further seal the display device 10. Such a cover may be a glass cover or a layer coated over the tile substrates 14. An optional optical coating 60 may be located over cover 30 or the tile substrates 14 or back panel 12 and employed to improve the optical quality of the display 10. Electrically insulating but thermally conductive material may be located between the display tiles 50 and the back panel 12 to improve the extraction of heat from the display 10.

In one embodiment of the present invention, the display tiles 50 are not individually encapsulated. Instead, the back panel 12, in combination with the display tile 50 substrate 14, is provided with an encapsulating seal, not shown. To achieve this, no vias are permitted through either the display tile substrate 14 or back panel 12. The seams 40 are sealed as is the space between the tile substrate 14 and back panel 12 around the edge of the back panel 12, using known materials such as epoxies. Preferably, the back panel 12 and the tile substrates 14 have a similar coefficient of thermal expansion to reduce mechanical stress due to heating during operation.

Sealing means may also be provided between the electrical standoff connectors 22 at the edge of the tiles 50 and the tile substrate 14 and back panel 12 so that individual display tiles 50 are individually sealed. Additional sealing layers may be employed over the second electrode 20 and are preferably thin so that the required height of the electrical standoff connectors 22 remains small. Alternatively, an encapsulating cover 62 may be employed over the second electrode to provide additional sealing but this increases the required height of the electrical standoff connectors 22.

In a preferred embodiment, the present invention is employed in a tiled flat-panel array of OLED display devices composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light emitting displays can be used to fabricate such a device.

The invention has been described in detail with particular reference to certain preferred embodiments thereof, but it will be understood that variations and modifications can be effected within the spirit and scope of the invention.

PARTS LIST 10 tiled display
12 back panel
14 tile substrate
16 first electrode
17 first side
18 light emissive or controlling materials
19 first side
20 second electrode
21' edge pixels
22 electrical standoff connectors
24 conductors
30 encapsulating cover
40 seam
50 display tile
51 edge
52 tile locations

What is claimed is:

1. A tiled display structure, comprising:
   a) a plurality of display tiles, each display tile comprising a tile substrate, first electrodes located on a first side of the tile substrate, light emitting or controlling materials deposited over a portion of the first electrodes leaving a first contact area without any light-emitting material or light-controlling material deposited thereon, and second electrodes being directly deposited over the light emitting or controlling material and connected directly onto the first side of the tile substrate in a second contact area different from the first contact area;
   b) a back panel having a plurality of back-panel conductors located on a first side of the back panel; and
   c) wherein the display tiles are mounted upon the back panel with the first side of the tile substrate adjacent to the first side of the back panel and the first and second electrodes electrically connected from the first and second contact areas on the first side of the tile substrate through electrical standoff connectors to the back-panel conductors.

2. The tiled display claimed in claim 1 wherein the display tiles are passive-matrix displays.

3. The tiled display claimed in claim 1 wherein the display tiles are active-matrix displays.

4. The tiled display claimed in claim 1 wherein the display tiles emit light through the tile substrate.

5. The tiled display claimed in claim 1 wherein the first electrodes are connected through a thin-film circuit to the electrical standoff connectors.

6. The tiled display claimed in claim 1 wherein the display tiles form a two-dimensional array on the back panel.

7. The tiled display claimed in claim 1 wherein the display tiles form a one-dimensional array on the back panel.

8. The tiled display claimed in claim 1 wherein the standoff connectors are formed from solder, pins, or deformable metal structures.

9. The tiled display claimed in claim 1 wherein the light emitting materials is an OLED material.

10. The tiled display claimed in claim 9 wherein the light emitting material further comprise layers of materials including one or more layers of hole-injection material, hole-transport material, emissive material, electron-injection material, and electron-transport material.

11. The tiled display claimed in claim 1 wherein the tile substrates have edges that are glued together with an adhesive optically matched to the tile substrate.

12. The tiled display claimed in claim 11 wherein the adhered edges form a hermetic seal.

13. The tiled display claimed in claim 11 wherein the glue has an optical index matched to the optical index of the tile substrate.

14. The tiled display claimed in claim 1 further comprising an optical coating located on a second side of the tile substrate.

15. The tiled display claimed in claim 1 further comprising an encapsulating cover located over the second side of the tile substrate and affixed to the back panel.

16. The tiled display claimed in claim 1 wherein the encapsulating cover is a layer.

17. The tiled display claimed in claim 1 further comprising an encapsulating material located between the first side of the tile substrate and the first side of the back panel.

18. The tiled display claimed in claim 1 wherein the electrical standoff connections are located on the periphery of the tile substrate.

19. The tiled display claimed in claim 1 wherein the electrical standoff connections are located between the first electrodes.

20. The tiled display claimed in claim 1 further comprising a display area and wherein the electrical standoff connections are located within the display area.

21. The tiled display claimed in claim 1 further comprising an electrically insulating and thermally conductive material located between the back panel and the display tile.

22. The tiled display claimed in claim 1 further sealing materials located between each display tile and the back panel to seal each display tile with the back panel.

* * * * *